United States Patent [19]

Chiao et al.

[11] Patent Number: 4,757,359
[45] Date of Patent: Jul. 12, 1988

[54] THIN OXIDE FUSE

[75] Inventors: Sun Chiao, San Jose; Chen Wang, Milpitas; Tarsaim L. Batra, Cupertino, all of Calif.

[73] Assignee: American Microsystems, Inc., Santa Clara, Calif.

[21] Appl. No.: 849,233

[22] Filed: Apr. 7, 1986

[51] Int. Cl.⁴ .......................................... H01L 29/78
[52] U.S. Cl. ...................... 357/23.5; 357/51; 361/58; 361/91
[58] Field of Search ............ 357/51, 23.5; 361/46, 361/54; 365/104, 200

[56] References Cited

U.S. PATENT DOCUMENTS

| 4,502,208 | 3/1985 | McPherson | 357/46 X |
| 4,503,519 | 3/1985 | Arakawa | 357/54 X |
| 4,507,757 | 3/1985 | McElroy | 365/104 |
| 4,546,454 | 10/1985 | Gupta et al. | 365/200 |
| 4,608,585 | 8/1986 | Keshtbod | 357/23.5 |

OTHER PUBLICATIONS

Sato et al., A New Programmable Cell Utilizing Insulator Breakdown, IEDM 85, pp. 639–642.

Primary Examiner—Roy N. Envall, Jr.
Assistant Examiner—Todd E. DeBoer
Attorney, Agent, or Firm—G. P. Edgell; R. J. Fox; E. E. Sachs

[57] ABSTRACT

An oxide fuse, and method of forming same, formed by a thin layer of oxide dielectric between a lower electrode substrate and an upper electrode. A fuse-programming bias of approximately 15V causes Fowler-Nordheim tunneling at low temperature to damage the dielectric layer, and shorts the upper and lower electrodes together. The oxide layer is advantageously formed simultaneously with the gate oxide layer in an EEPROM.

3 Claims, 1 Drawing Sheet

THIN OXIDE FUSE

BACKGROUND OF THE INVENTION

This invention concerns integrated circuit electronics and more particularly a programmable fuse embodied in an integrated circuit.

Programmable fuses make it possible for a completed and packaged integrated circuit (IC) to be configured as desired by biasing terminals of the IC with voltages appropriate to alter selected fuses. For example, IC options such as output signal polarities can be programmed by fuses.

Integrated circuit memories comprise many essentially identical one bit memory element cells, arranged in rows and columns. When the completed IC is tested, some cells are usually found to be defective. IC memories are commonly provided with spare ("redundant") cells, and programmable fuses which can be selectively altered to reconfigure the memory circuit and substitute spare cells for defective cells, thereby repairing the memory.

In electrically programmable nonvolatile memory circuits (i.e. memories capable of retaining data without being continuously supplied with power), memory elements comprise either permanently programmable fuses, or indefinitely programmable, and erasable, charge traps. A fuse memory element in its initial unaltered state represents one binary value, and is programmed or altered to represent the other binary value.

Integrated circuit fuses generally have the drawback of requiring programming voltages and currents substantially above the normal operating range of typical integrated circuits. The fuse programming power requires relatively large access (addressing) transistors, which increase the size and cost of the IC, and also lengthen the time needed during normal operation to access the circuit elements. Lower fuse programming voltages more compatible with normal IC operating ranges are desirable.

In bipolar programmable read only memory (PROM) devices, fuses are typically formed by reduced cross section high resistance intervals in polycrystalline silicon or metal access lines to the memory cells. Polycrystalline silicon and metal (such as titanium-tungsten) fuses, like fuses in general, are initially closed (i.e. conductive) and programmed to be open (nonconductive). Applying a high voltage, typically 15 to 20 volts, to a polycrystalline silicon fuse causes typically 25 to 30 mA of current, which heats and oxidizes the polycrystalline silicon fuse into insulating $SiO_2$.

ICs are normally covered with a protective passivating layer of $Si_3N_4$, $SiO_2$, or sandwich of $Si_3N_4/SiO_2$. However, the heat from burning a polycrystalline silicon or metal fuse is also likely to fracture the overlying passivating layer. Therefore, polycrystalline silicon fuses require an opening in the overhead passivating layer to allow dissipation of heat during the programming of fuses. Unfortunately, any environmental moisture which penetrates the IC package is heated to a high temperature by blowing the polycrystalline silicon fuses, and can corrode conductors or electrical contacts not covered by the passivation layer. ICs using polycrystalline silicon fuses need to be hermetically sealed in ceramic packages, which are more expensive than the plastic packages which could otherwise be used.

Electrically programmable ROMs are also made from field effect devices. U.S. Pat. No. 4,502,208 describes a fuse 10 (FIG. 1) formed in substrate 11 by a V-groove 12 lined with 500±50 angstroms of oxide dielectric 14 and covered with polycrystalline silicon electrode 16. Polycrystalline silicon 16 is connected to the source region of an associated access transistor (not shown). A programming voltage applied to both the gate and drain of the access transistor biases electrode 16 to create an electric field, focused at the apex of V-groove 12, which draws electrons through oxide dielectric 14 in an intense current which breaks molecular bonds in, or "ruptures", dielectric 14 while not breaking down planar gate oxide of the same thickness in the accompanying access transistor. Fuse oxide 14 may be formed thinner (500 angstroms) than the access transistor gate oxide (800 to 1000 angstroms) to facilitate breaking down the fuse oxide. Although the 0.3 mW of power used to program fuse 10 does not require large access transistors, the 25 volt programming voltage is significantly more than the normal operating range of a typical IC memory in which fuse 10 would be used. In addition, the depth of the V-groove, and thus the penetration of the apex into substrate 11, is difficult to control. One would not think of making oxide layer 14 thinner still, because thinner oxides have not been reliably reproduceable until recent developments in the separate technology of Electrically Eraseable Programmable Read Only Memories (EEPROMs).

Memory elements in erasable PROMs (EPROMs) are nondestructively (reversibly) programmed by charge traps rather than permanently programmed fuses. One type of EPROM, a Floating gate Avalanche junction MOS (FAMOS) device, resembles structure 20 of FIG. 2, which can also be used for a fuse, as explained below. In use as an EPROM, structure 20 operates basically like an NMOS transistor except that gate 23 "floats" electrically unconnected. With source 21 held at ground potential, 15 to 50 volt pulses applied to drain 26 reverse bias channel-drain PN junction 25 so that thermally generated electrons are accelerated with sufficient force that collisions dislodge other electrons and multiply the number of electron-hole pairs, generating an avalanche breakdown current of about 1 nA. Collisions scatter some electrons by hot electron injection into overlying oxide layer 24. Gate oxide 24 is not adversely affected by this current. Some electrons which penetrate oxide layer 24 are trapped in charge traps in floating gate 23 and exert an electric field which determines the conduction threshold of channel 22 and thereby programs cell 20. Exposing floating gate 23 to ultraviolet (U.V.) light excites trapped electrons, some of which are emitted from the bottom of gate 23 through oxide 24 to channel/substrate 22, thereby removing charge from floating gate 23, and thus "erasing" the cell. EPROMS are normally packaged in ceramic packages (not shown) which have a quartz window above the floating gates to admit U.V. light. The quartz window can be covered to block out radiation, or the EPROM can be packaged in a cheaper plastic package without a quartz window, to make the EPROM non-erasable and thus one-time programmable, which is equivalent to a PROM.

U.S. Pat. No. 4,507,757 to McElroy describes an oxide fuse 20 (FIG. 2), similar to a FAMOS EPROM transistor, in which gate 23 is connected to a lead (not shown) rather than floating. Fuse 20 is programmed one-time by reverse biasing channel body-drain PN junction 25 by 20 volts, which causes intense avalanching. Scatter-injected electrons heat and burn oxide 24, leaving a hole into which adjacent polycrystalline silicon melts, shorting gate 23 to drain 26. Oxide 24 is formed in a separate process step to be thinner (approximately 300A) and to have lower break down characteristics than the approximately 600A thick gate oxide used for access transistors (not shown). The 20 volt bias applied to gate 23 causes a field-plate effect between gate 23 and drain 26, which reduces the voltage necessary for reliable avalanche breakdown of oxide layer 24 to about 20 volts, which is less than the 25 volt programming voltage of fuse 10 (FIG. 1), but still exceeds, and is incompatible with, the normal operating range of typical integrated circuits. Junctions 25 for nonprogrammed cells have to withstand 25 volts, which makes it very difficult to "scale down" (reduce) the size of fuse 20. EPROM dimensions are presently scaled down to 1.25 micron width lines, with 250 angstrom thick gate oxide layers.

An electrically erasable EPROM (EEPROM) (not shown) is formed by a floating gate tunnel oxide (FLOTOX) structure which resembles an EPROM. A high programming or "write" potential (20V) applied to the control gate creates an electric field which draws electrons by Fowler-Nordheim tunneling from the grounded channel through a thin (50 to 200A) layer of thermally grown tunnel oxide, to be trapped in the floating gate and remain to exert an electric field on the underlying channel and thereby program the threshold voltage, as in an EPROM. The control gate charge is erased by an applied potential opposite the write potential which draws holes through the thin tunnel oxide to neutralize a previously written electron charge. In some prior art EEPROMS, one-time programmable memory elements are provided by spare EPROM cells rather than by fuses. Spare EEPROM cells are manufactured with no extra process steps, and are programmed using normal IC voltage levels, but are larger than other fuses. Also, erasable cells tend to leak charge and eventually revert to the erased (unprogrammed) state. There remains, therefore, a need for a one-time programmable fuse which is produced with no, or a minimum number of, additional process steps in an MOS IC memory device, which is small and does not require excesively high programming voltages, which has a small propagation delay, which is reliable, and which does not require an overhead opening, thereby making it suitable for use in circuits packaged in plastic packages.

SUMMARY OF THE INVENTION

It is therefore an object of this invention to provide an integrated circuit fuse which, when being programmed, does not generate heat requiring an overhead opening or special protective packaging, and which therefore can be reliably packaged in a low cost plastic package. Another object is to provide a fuse programmable by voltages closer to typical IC operating ranges. Another object is to provide a smaller fuse.

The present invention achieves these objects by providing a fuse which is programmable by Fowler-Nordheim tunneling, a mechanism that occurs at lower voltages and in thinner oxides than prior art fuse programming mechanisms. Fowler-Nordheim tunneling through oxide of a controlled thickness is predictable over a wider tolerance of fuse area and programming voltages, and thus is more reliable, than avalanche breakdown used in prior art fuses formed from thicker oxide. The lower programming voltage permits fuses according to this invention to be scaled down for use with sub-micron line-width technologies. With a given distribution of defects in the oxide, thinner oxide layers are less likely to contain defects, which also contributes to the improved reliability of fuses constructed according to this invention.

Fuses are fabricated according to one embodiment of this invention in an EEPROM with no extra process steps by using the tunnel oxide layer for fuse oxide, and using the floating gate polycrystalline silicon for the upper electrode of the fuse. Fuses are made according to another embodiment of this invention in an EPROM with one additional mask and process step. The fuse of this invention can be used, for example, in making EEPROMS, EPROMS, and one-time programmable EPROMs which are smaller, cheaper, and more reliable than previously possible.

DESCRIPTION OF THE PREFERRED EMBODIMENT

Figure 1:
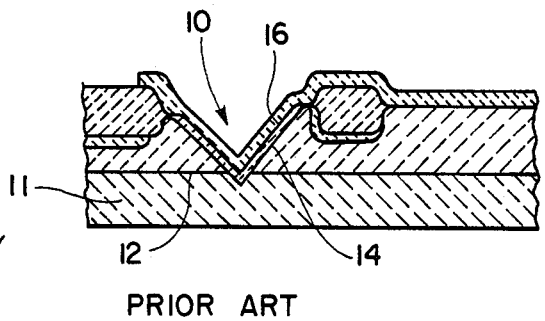
FIG. 1 is a cross section of a prior art oxide fuse in which a programming voltage of 25 volts opens a hole by destructively burning through a 500 angstrom layer of oxide and melts a polycrystalline silicon electrode into the hole to short the fuse.
Figure 2:
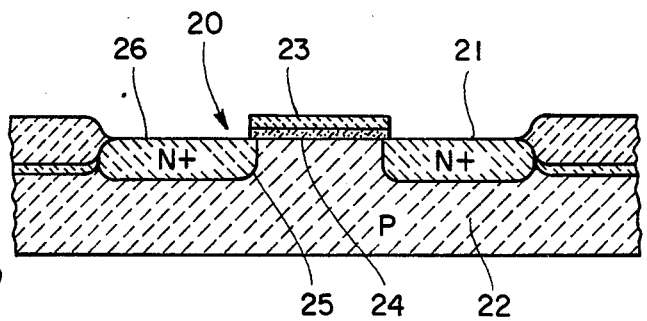
FIG. 2 is a cross section of a prior art EPROM-type fuse in which a programming voltage of 20 volts causes intense avalanche breakdown in a PN junction and opens a hole through an adjacent 300 angstrom layer of oxide and melts a polycrystalline silicon electrode into the hole to short the fuse.
Figure 3:
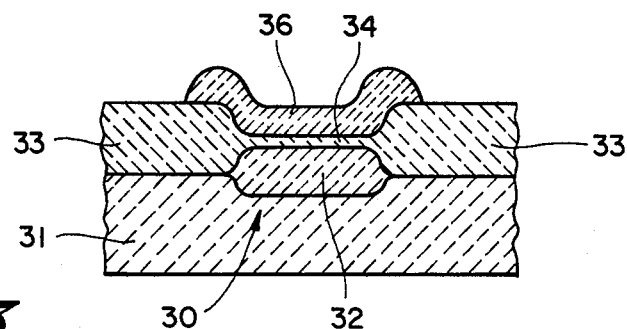
FIG. 3 is a cross section of one embodiment of a fuse constructed according to the present invention in which a programming voltage of 15 volts opens a pin hole by Fowler-Nordheim tunneling through an approximately 110 angstrom thick layer of oxide to short the fuse.

The present invention is shown in its preferred embodiment as fuse 30 in FIG. 3. Fuse 30 is initially nonconductive or open, and is programmed or altered at low temperatures to be conductive or closed, so overlying passivation is not fractured. Thus, fuse 30 does not need special protection from its environment and is suitable for use in circuits packaged in plastic, particularly EEPROMS or EPROMS. The approximately 15 volts and several microamps of current used for programming fuse 30 are lower, and more compatible with typical IC operating ranges, than prior art fuse programming voltages.

Fuse 30 includes lower electrode 32, field oxide layer 33, having a thick field portion, oxide layer 34, and upper electrode 36. Fuse 30 is formedin and on a substrate 31 which is also used to form other devices (not shown) together forming an integrated circuit, such as a memory device. Substrate 31 may be an intrinsic semiconductor or doped with P or N type impurities. Substrate 31 is optionally further doped with P or N type impurities, to form lower electrode 32.

Figure 4:
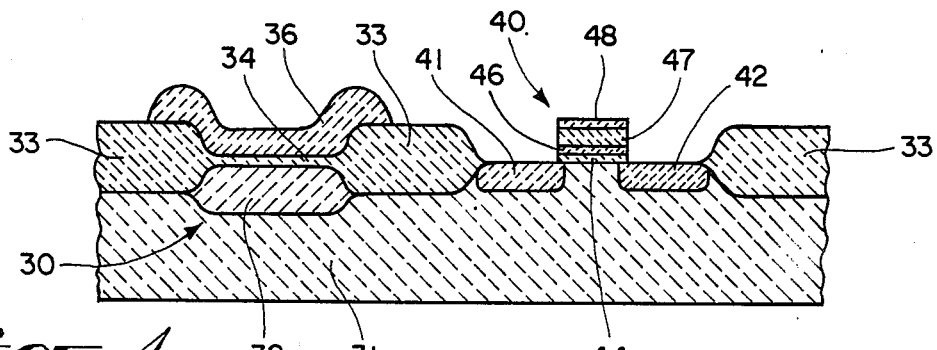

Production of an oxide layer 34 as thin as approximately 80 angstroms to 110 angstroms and of sufficiently high quality for reliable and consistent programming requires that the surface of substrate 31 be well cleaned aforehand, preferably by hydrogen chloride (HCl) followed by ammonia (NH$_4$OH). Oxide layer 34 is preferably thermally grown over an approximately four square micron area on the surface of substrate electrode 32. A fuse 30 embodied in EEPROM 40, as shown in FIG. 4, is preferably formed at the same time as tunnel oxide layer 44. The formation of EEPROMS is well-known in the art and may be further understood by reading Keshtbod, U.S. Pat. No. 4,608,585. Source region 41 and drain region 42 are formed by doping regions 41 and 42 with impurities of opposite conductivity type as substrate 31. One additonal mask and one additional thermal cycle beyond the normal processing steps are required to form thin oxide 34 for a fuse 30 in an EPROM.

On top of oxide 34, a layer of polycrystalline silicon is deposited to any convenient thickness and doped to any convenient conductivity, in order to form upper electrode 36. In a fuse 30 embodied in an EPROM or EEPROM, as shown in FIG. 4, upper electrode 36 is preferably formed from polycrystalline silicon floating gate 46 or control gate layer 48. Insulation layer 47 is formed to insulate floating gate 46 from control gate layer 48. Fuse 30 initially has a very high resistance, in the range of megaohms.

Fuse 30 is programmed by applying 10 or more volts, preferably 15 volts for practically complete reliability, via a conductive lead (not shown), to upper electrode 36, with substrate 31 held at ground. The potential on electrode 36 establishes an electric field across oxide 34 which causes Fowler-Nordheim tunneling current from electrode 32 through oxide 34 in the range of one microamp, which is sufficiently intense to break down oxide dielectric 34.

Fuse 30 is not only much smaller but also more reliable than EEPROM cells used as programming elements for redundancy substitutions because an EEPROM uses a floating gate charge trap to store charge which maintains a stressing field on the underlying channel. The tendency of charge to leak out presents a data-retention problem. Once the EEPROM is tested, defective memory cells are detected, and redundancy substitution repairs are done, by programming selected fuses to substitute redundant memory cells for defective cells. Sensing (reading) an EEPROM cell for its unprogrammed/programmed value creates a relatively strong 3 mV/cm disturbance field around the cell, which limits the density compaction of the EEPROM circuit. In contrast, oxide fuse 30 is a permanent connection without data retention problems associated with charge leakage. Fuse 30 can be sensed (read) by a sense voltage as low as 1.0 volt. A 2.0 volt sense voltage causes a 94 microamp current which results in less of a disturbance field than that involved in reading an EEPROM cell. The lesser disturbance field allows oxide fuse 30 to be spaced more closely than an EPROM cell to other circuit elements.

A preferred embodiment has been illustrated, of which modifications and adaptations within the scope of the invention will occur to those skilled in the art. The invention is limited only by the scope of the following claims.

We claim:

1. A fuse in an integrated circuit formed on an upper surface of a silicon semiconductor substrate, comprising:

a lower electrode region in said silicon semiconductor substrate adjacent said upper surface;

a substantially planar thermally grown silicon oxide layer formed on said upper surface over said lower electrode region and having a thick field portion and a thin tunneling portion formed integral with the thick field portion, said thin tunneling portion of said silicon oxide layer being positioned over said lower electrode region, said thin tunneling portion of said silicon oxide layer having a thickness suitable to conduct a Fowler-Nordheim tunneling current which damages said thin tunneling portion of said silicon oxide layer when said thin tunneling portion of said silicon oxide layer is subjected to a programming bias in the range of approximately 10 volts to 15 volts; and an upper polycrystalline silicon electrode disposed over said thin tunneling portion of said silicon oxide layer, connectable in a circuit with said silicon semiconductor substrate to apply a programming bias through said thin tunneling portion of said silicon oxide layer between said upper electrode and said lower electrode region, and which, when said thin tunneling portion of said silicon oxide layer is damaged by said Fowler-Nordheim tunneling current, forms an electrically conductive connection to said lower electrode region.

2. A fuse in an integrated circuit formed on an upper surface of a silicon semiconductor substrate as defined in claim 1, wherein the thickness of said thin tunneling portion of said silicon oxide layer is in the range of approximately 80 to 100 angstroms.

3. A fuse in an integrated circuit formed on an upper surface of a silicon semiconductor substrate as defined in claim 1, wherein said lower electrode region is doped with impurities to a higher conductivity than adjacent regions of said substrate.

* * * * *